United States Patent [19]

Searing et al.

[11] Patent Number: 5,379,390
[45] Date of Patent: Jan. 3, 1995

[54] RATE/RATIO DETERMINING APPARATUS

[75] Inventors: Lawrence G. Searing, Nashotah; Richard L. Toye, Brookfield, both of Wis.

[73] Assignee: Eaton Corporation, Cleveland, Ohio

[21] Appl. No.: 219,817

[22] Filed: Mar. 28, 1994

Related U.S. Application Data

[63] Continuation of Ser. No. 117,637, Sep. 7, 1993, abandoned, which is a continuation of Ser. No. 571,918, Aug. 22, 1990, abandoned.

[51] Int. Cl.[6] ............................................. G06F 9/46
[52] U.S. Cl. ................................. 395/375; 395/650; 364/DIG. 2; 364/921.8; 364/942.5; 364/942.7; 364/949.3; 364/949.5; 364/951; 364/484; 364/556
[58] Field of Search ............... 395/375, 550, 650, 725; 364/484, 556

[56] References Cited

U.S. PATENT DOCUMENTS

| | | | |
|---|---|---|---|
| 4,523,277 | 6/1985 | Schnathorst | 364/200 |
| 4,611,294 | 9/1986 | Stanfill | 364/173 |
| 4,636,944 | 1/1987 | Hodge | 364/200 |
| 4,734,882 | 3/1988 | Romagosa | 364/900 |
| 4,792,890 | 12/1988 | Blair et al. | 364/200 |
| 4,800,508 | 1/1989 | Frederich | 364/484 |

OTHER PUBLICATIONS

Technical Manual for "MAX" Rate and Draw Indicator Published by Dynapar Corp.

*Primary Examiner*—Eddie P. Chan
*Attorney, Agent, or Firm*—Watts, Hoffmann, Fisher & Heinke Co.

[57] ABSTRACT

A frequency determination system and method for frequency determination. A programmable controller responds to receipt of a sequence of pulses. A number of interrupts of different priority level perform rate or frequency calculation in an efficient manner. Pulses are counted upon receipt but the actual rate calculation is performed by a low priority software routine. By performing only essential counting functions when pulses occur, the programmable controller can perform other tasks in addition to the rate calculations. In the disclosed design, the controller can monitor serial communications in addition to performing the rate calculation task.

6 Claims, 11 Drawing Sheets

RATE/RATIO DETERMINING APPARATUS

This is a continuation of copending application Ser. No. 08/117,637 filed on Sep. 7, 1993, which is a continuation of application Ser. No. 07/571,918, filed Aug. 22, 1990, now both abandoned.

TECHNICAL FIELD

The present invention relates generally to frequency counters and in particular to a new and improved rate/ratio counter capable of measuring the pulse rate of relatively high frequency signals while maintaining serial communication with a host device and conducting other tasks such as rate/ratio calculations.

BACKGROUND ART

Devices for measuring the frequency of an input signal are used in many applications and are well known. Rate/ratio meters used in process control are a form of frequency counter. In one application, the rate of flow in a conduit is monitored by a flow meter, the output of which, is a series of pulses that represent the rate of flow being measured. The frequency of pulses varies with the fluid flow rate. A rate meter or indicator connected to the flow meter must determine the number of pulses per time interval in order to arrive at a flow rate that corresponds to the pulse frequency received.

In other applications, the rate meter/indicator is connected to a motor speed sensor or a web speed sensor. Again the rate meter/indicator counts pulses that are output from the sensor. The pulse rate emitted by the sensor is normally proportional to the speed.

Rate indicators/meters are commercially available that are capable of determining pulse rates for a predetermined range of frequencies. In many cases, the maximum pulse frequency that can be counted is determined by the hardware and/or software forming part of the device.

As process control becomes more sophisticated, it is desirable to provide rate meters that are capable of monitoring two frequency inputs simultaneously and to calculate rate differences, ratios and other information related to the inputs. For example, in some applications it is desirable to determine the ratio of the two frequencies being monitored (which correspond to the flow rates of two different supplies). Some applications require the calculation of a rate difference between the two flow rates being monitored while still other applications require the calculation of a "draw" which is a percentage and is determined by the difference between the two flow rates divided by one of the flow rates.

It is also desirable to have a rate/ratio meter that can communicate with a host computer via a serial interface so that commands may be sent to the meter from the host computer and so the data received by the meter can be transmitted directly to the host computer.

Many if not most of these types of devices utilize microprocessors to control their operation and to perform the desired calculating tasks and the monitoring functions. The performance of a given meter is therefore a function of the speed with which the device can perform these chores.

It has been found that many devices have substantial performance degradation when serial communications are established between the device and the host computer. If the pulse counting and rate determination are conducted as high priority tasks, serial communications will suffer and characters may be lost especially at high baud rates. If the serial communication is conducted as a high priority task, pulse counting may be inaccurate since counts will be lost while serial communication tasks are being performed.

As is known, in order to determine the frequency of a signal, one must determine the number of pulses that have occurred in a given period of time. These two quantities can then be used to calculate the frequency. In some devices, the so-called "sample period" is a fixed amount of time and the device simply counts the number of pulses that occur in the fixed interval of time to arrive at a frequency. This type of calculation may prove inaccurate especially at low frequencies since the period may begin and/or end between pulses and therefore the period is in effect longer than the actual interval of time that occurred between the first pulse and the last pulse.

To improve the accuracy of the frequency determination, at least some devices implement the "reciprocal-time method" (also termed 1/tau) to measure the exact time between the starting pulse and the end pulse. In this method, an average sample time is preset. However, the timer does not begin to increment until the first pulse has been received. The "sample interval" actually terminates on the pulse following time out of the average sample timer. As a result, the sample period used in the frequency calculation is the actual time period between the first and last pulse.

Implementing the 1/tau method of calculating frequency in software takes additional microprocessor cycles as compared to the fixed sample period method of calculating frequency. The performance of devices that implement the 1/tau method in software may experience performance degradation as the frequencies of the signals being monitored increase and will experience even further degradation if the devices are in serial communication with a host computer.

DISCLOSURE OF THE INVENTION

The present invention provides a new and improved frequency counter. The disclosed frequency counter is especially adapted to be used as a rate meter/ratio indicator that is capable of simultaneously monitoring two inputs while conducting serial communications at 19,200 baud with a host device without loss of characters.

The high performance capability of the disclosed invention is achieved by distributing the various tasks that need to be performed in hardware and in software modules that operate at different priority levels.

According to the invention, the system includes a microprocessor for executing sets of instructions stored in memory. A free-running period timer is implemented in hardware which preferably is a counter that increments a count at predetermined intervals such as 1 microsecond. By storing the state (i.e. the number of counts) of the period timer upon the receipt of a first pulse and again upon receipt of the last pulse (after a predetermined sample interval has been exceeded), an accurate time interval can be calculated (by subtracting the stored timer states and dividing this number by the rate at which the period timer is incremented).

The step of saving the state of the period timer is performed as part of a "capture" function. According to the invention, the capture function itself is divided into separate tasks operating at different priority levels. In particular, the receipt of a signal pulse at an input generates a high priority interrupt. Generation of the high priority interrupt transfers control to a high priority interrupt processing control module which first determines whether the capture function has been accomplished. In the disclosed embodiment the capture function is enabled when a preset sample time has been exceeded. When the capture function is enabled, the receipt of a signal pulse simultaneously generates the high priority interrupt and causes the capture of the period timer's state. If the capture function has not been accomplished, the high priority interrupt control module increments a temporary counter and the module is exited.

If the capture function has been accomplished, the state of the period timer is stored in a register and a first low priority interrupt is generated. The presence of this first low priority interrupt transfers control to a secondary capture module that completes the capture function, as long as a high priority task is not being performed. As a result, the receipt of pulses at the input will take precedence over the secondary capture function and since the high priority task takes a minimal amount of time to execute, the system is capable of monitoring relatively high frequency signals without degrading performance in other functions and without loss of characters during serial communications. The secondary capture function is completed between high priority tasks.

In the illustrated embodiment, a second timer is implemented which is arranged to generate a second low priority interrupt at predetermined intervals. In the disclosed hardware, which utilizes an Intel 83C51F series microprocessor, a timer internal to the microprocessor is used to generate this low priority timer interrupt every 2.5 milliseconds. It should be understood that, for some applications, the timer interval will be different and may be implemented in other hardware or even software, especially if a different microprocessor is employed.

The generation of the low priority timer interrupt transfers control to an associated module as long as higher or equal priority tasks are not being performed. When control is transferred to the module associated with this timer interrupt, data storing and transfer functions such as transferring data from temporary to accumulating registers is performed.

As indicated above, the illustrated system utilizes an Intel 83C51F series microprocessor. This particular microprocessor includes a programmable counter array (PCA). In the preferred embodiment, the PCA is configured as the free-running period timer which in the illustrated embodiment increments every 1 microsecond.

The counts of the PCA timer are stored in a 2 byte register and as a result an overflow will occur every 65,536 counts. In accordance with the invention, the number of overflows that occurred during the sample period are accumulated in a separate overflow counter that is preferably implemented in software. When a period calculation is made, the number of overflows that have occurred during the sample period multiplied by 65,536 is added to the number of counts in the 2 byte PCA timer register and stored in a period capture register.

When the secondary, low priority capture function has been completed, a "do rate" flag is set. The low priority timer interrupt initiates a low priority task which then performs the various rate calculations and clears the "do rate" flag upon completion of the calculations.

With the disclosed method and apparatus, an extremely high performance rate/ratio indicator is achieved. Because the counting and calculating tasks are distributed in both hardware and software operating at different priorities, relatively high frequencies at two different inputs can be monitored while maintaining serial communication between the counting device and a host computer. The bulk of the capture and calculation functions are performed as low priority tasks in between high priority counting tasks, and consequently count information is not lost even at high frequencies.

Additional features of the invention will become apparent and a fuller understanding obtained by reading the following detailed description made in connection with the accompanying drawings.

BEST MODE FOR CARRYING OUT THE INVENTION

Figure 1:
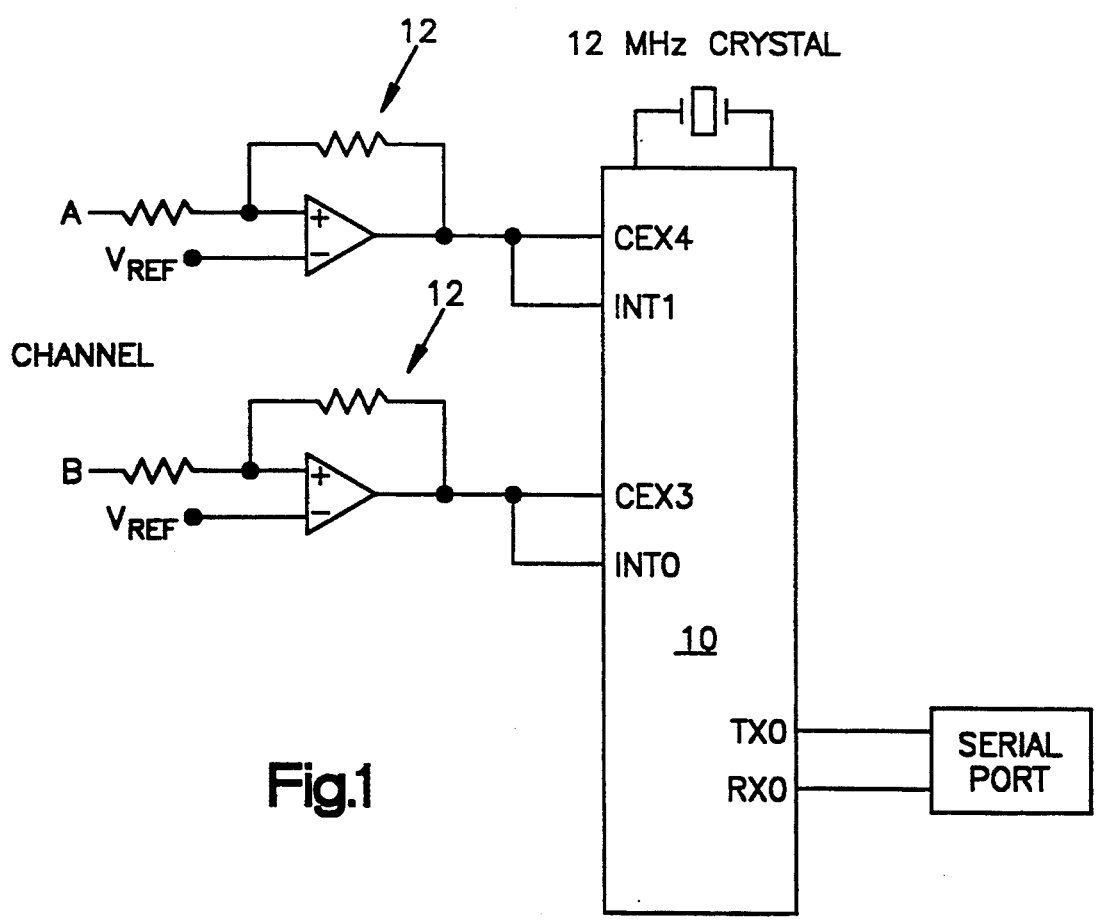
FIG. 1 is a portion of an electrical schematic of a rate/ratio meter embodying the present invention.

FIG. 1 illustrates a hardware schematic for a portion of a frequency counter embodying the present invention. In the illustrated embodiment, a pair of frequency inputs A, B are connected to a microprocessor 10 which, in the illustrated embodiment, is an Intel 83C51F series microprocessor. The frequency inputs or channels A, B are communicated to the microprocessor via signal conditioning circuitry illustrated generally by the reference character 12. The frequency input A after passing through the signal conditioning circuitry 12 is connected to external interrupt INT1 whereas frequency input B is connected to external interrupt INT0.

Figure 2:
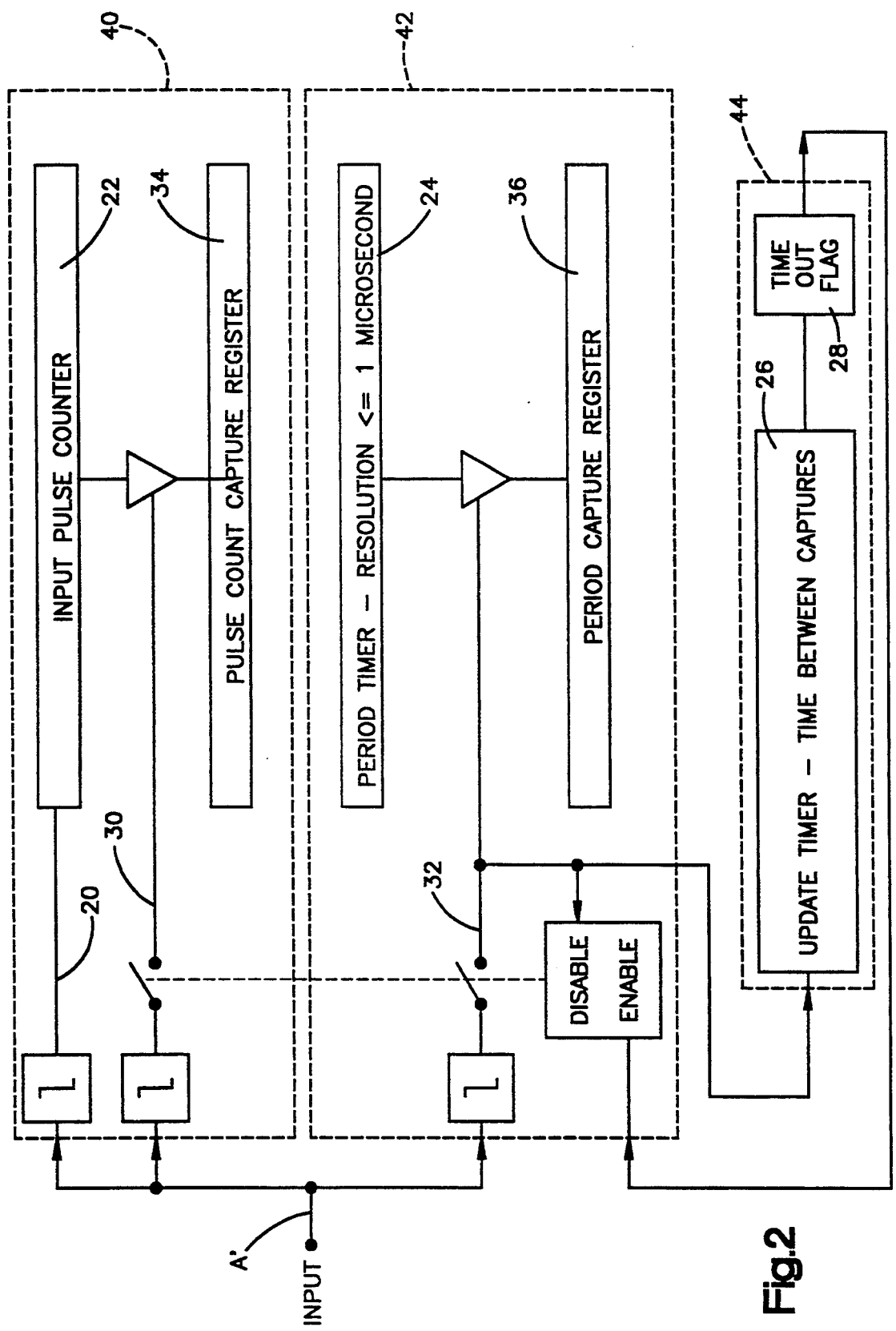
FIG. 2 is a block diagram illustrating the steps that need to be performed in order to determine the frequency of a signal and also illustrating how a portion of a data capture function is implemented in the present invention.

In general, the frequency of an input signal is determined by counting input pulses for a predetermined period and then dividing the accumulated counts by the period to determine frequency. FIG. 2 schematically illustrates an overview of the steps that need to be performed in order to determine a frequency of a signal. An input signal is received at a point A'. When a data "capture" function has not been enabled, the pulse follows the path 20 and increments a pulse counter 22 ("CNT").

Throughout the counting process, a period timer indicated by the block 24 is running. The period timer 24 may be a counter that increments, for example, every one microsecond. As is known, to determine the frequency, the number of pulses received and the time between the first and last pulse must be obtained. In the illustrated method, an "update timer" 26 determines the measurement time period. In particular, if the measurement or sample time period is one second, the update timer issues a time-out flag 28 every one second. The time-out flag 28 enables the "capture" sequence.

As shown schematically, when a capture is enabled, the signal paths 30, 32 are bridged. When enabled, the next incoming pulse causes the contents of the input pulse counter 22 (CNT) to be saved to a pulse count capture register 34 while at the same time, the state of the period timer 24 is captured in a period capture register 36. The state of the input pulse counter at a previous capture (which is saved in a "previous pulse count capture register", not shown in FIG. 2) is subtracted from the pulse count capture register to arrive at the number of counts that have been accumulated since the prior capture. Similarly, the state of the period timer saved from the previous capture is subtracted from the count in the period capture register to arrive at the time period over which the counts were accumulated. Using the accumulated counts and the calculated time period, the frequency of the input signal can be determined. This method of determining frequency is considered highly accurate since the actual period between captures is triggered by pulses as opposed to counting pulses for a fixed interval of time.

The method for determining the frequency of a signal illustrated in FIG. 2 may be implemented in hardware, software or both. According to the present invention, the input pulse counter and pulse count capture register and the transfer of counts between these registers are achieved in software which is represented by the block 40 in FIG. 2. The period timer as well as the step of transferring timer information to a period capture register is implemented in hardware and indicated by the block 42. The update or sample timer, as will be explained, is preferably programmable and is implemented by a stored software module and is represented by the block 44 in FIG. 2.

In accordance with the invention, the tasks that need to be performed, i.e., pulse counting, period determination and frequency calculation are divided into individual tasks having different degrees of priority. High priority tasks are designed to take minimal amounts of time whereas low priority tasks, which are suspended in response to high priority interrupts, are executed over longer periods of time (in between the high priority tasks). As a result, the disclosed frequency counter can monitor the two frequency inputs A, B and perform the necessary frequency calculations while conducting serial communications at 19,200 baud.

This performance is achieved by providing a distributed rate capture scheme. In the preferred embodiment, pulse counting and storing the state of the pulse counter in the pulse count capture register 34 is performed by software whereas a portion of the period capture function, i.e. storing the state of the period timer 24 and the state of the period capture register 36, is performed in hardware. The rest of the capture function, i.e. determining the actual time between the first and last pulse in the sample interval and calculating the frequency, is implemented in software as a low priority task. The interval determination, arithmetic functions, and pulse count accumulating functions are distributed over several software modules that run at different interrupt priorities. Overflows of the period timer are also handled as a low priority software task.

Figure 3:
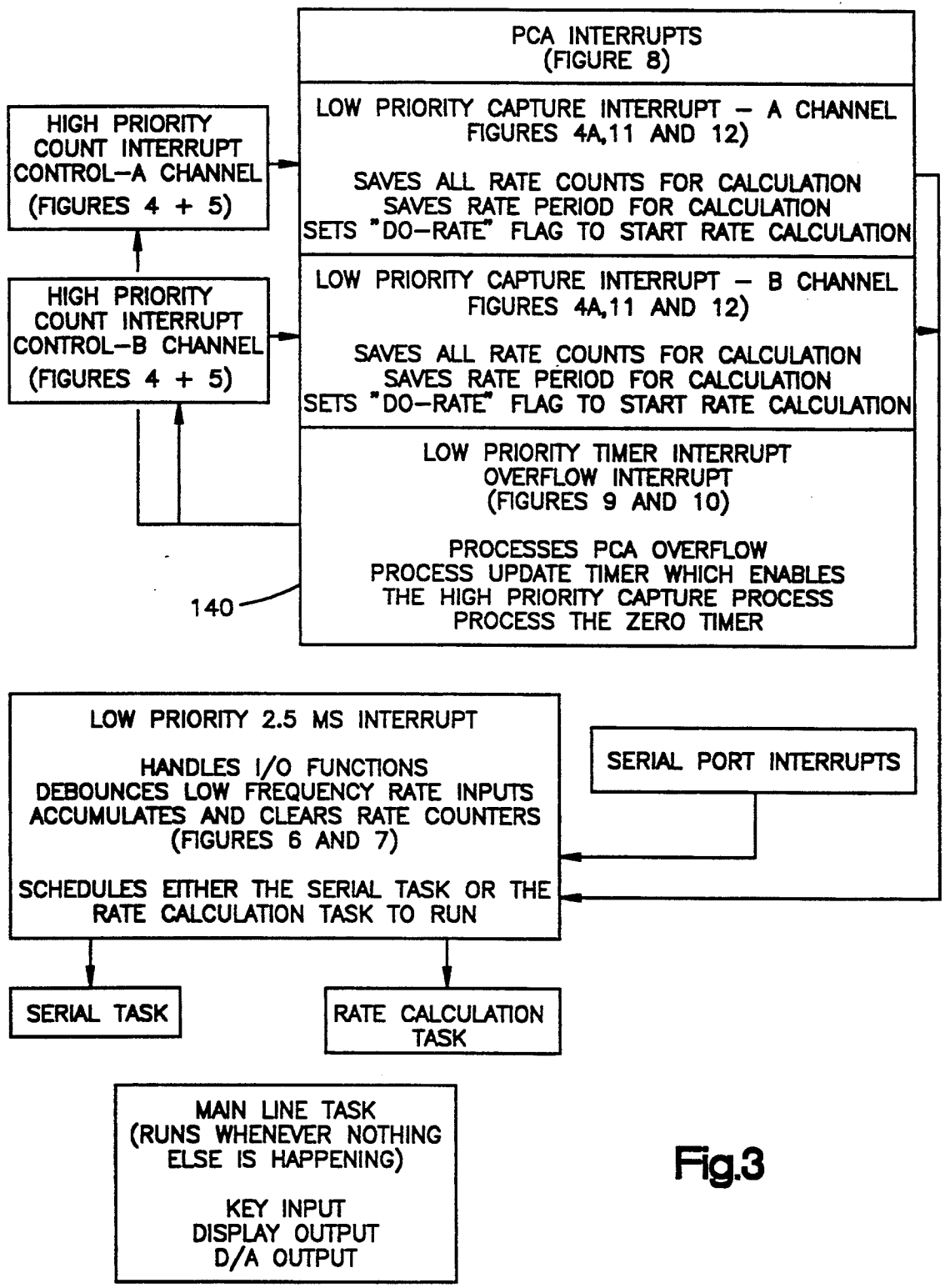
FIG. 3 is another block diagram illustrating the hierarchy of various interrupts and tasks that are performed by the present invention.

FIG. 3 illustrates an overview of the interrupt and task structure performed by the microprocessor and associated software. Each incoming pulse generates a high priority interrupt. As will be explained in further detail, the high priority interrupt causes a minimal amount of functions to be performed so that significant processor time is not needed to complete the task. In particular, when data does not need to be captured, the high priority interrupt routine checks whether a capture is needed and increments a one byte counter. If the capture function has not been enabled, the subroutine is exited immediately.

When the need for a capture is signalled, by a mechanism to be described, the generation of the high priority interrupt (generated by the next incoming pulse) stores information regarding the total number of counts accumulated. The state of the period timer is stored by the microprocessor's hardware in the period capture register (generated by the incoming pulse). The high priority interrupt control software also sets a flag indicating that a capture has been made. When the capture flag is set, indicating that a high priority capture has been made, it causes the execution of a low priority capture task when higher priority tasks are not being performed. This low priority task completes the capture function, i.e. determines the number of pulses that were received during the sample period and the length of the sample period. It also sets a flag to indicate that the arithmetic calculations to determine the actual frequency rate and other information determined by the device are to be executed. Again this is performed at a much lower priority level.

As seen in FIG. 3, a software module is also executed upon the generation of a timer interrupt which, in the illustrated embodiment, occurs when an internal timer forming part of the microprocessor overflows. In this family of microprocessors, this timer is termed a programmable counter array or PCA timer. In the preferred embodiment, this timer is configured as a free running timer and is used to determine the sample period. In particular, by capturing the timer count at the beginning of the period and subtracting this initial timer count from the final count at the end of the period, a period or sample time can be determined.

As also seen in FIG. 3, a low priority interrupt is also generated every 2.5 milliseconds. This is achieved by another timer internal to the microprocessor. The software executed by this low priority 2.5 millisecond interrupt handles I/O functions, accumulates and clears various counters, as will be described, and also schedules the actual rate calculation task based on the data captured. As is conventional, a "mainlined" is executing whenever the interrupt driven software is not. It should be understood that the modules that are executed upon generation of an interrupt form subroutines in the overall software that controls or operates the device.

Figure 4:
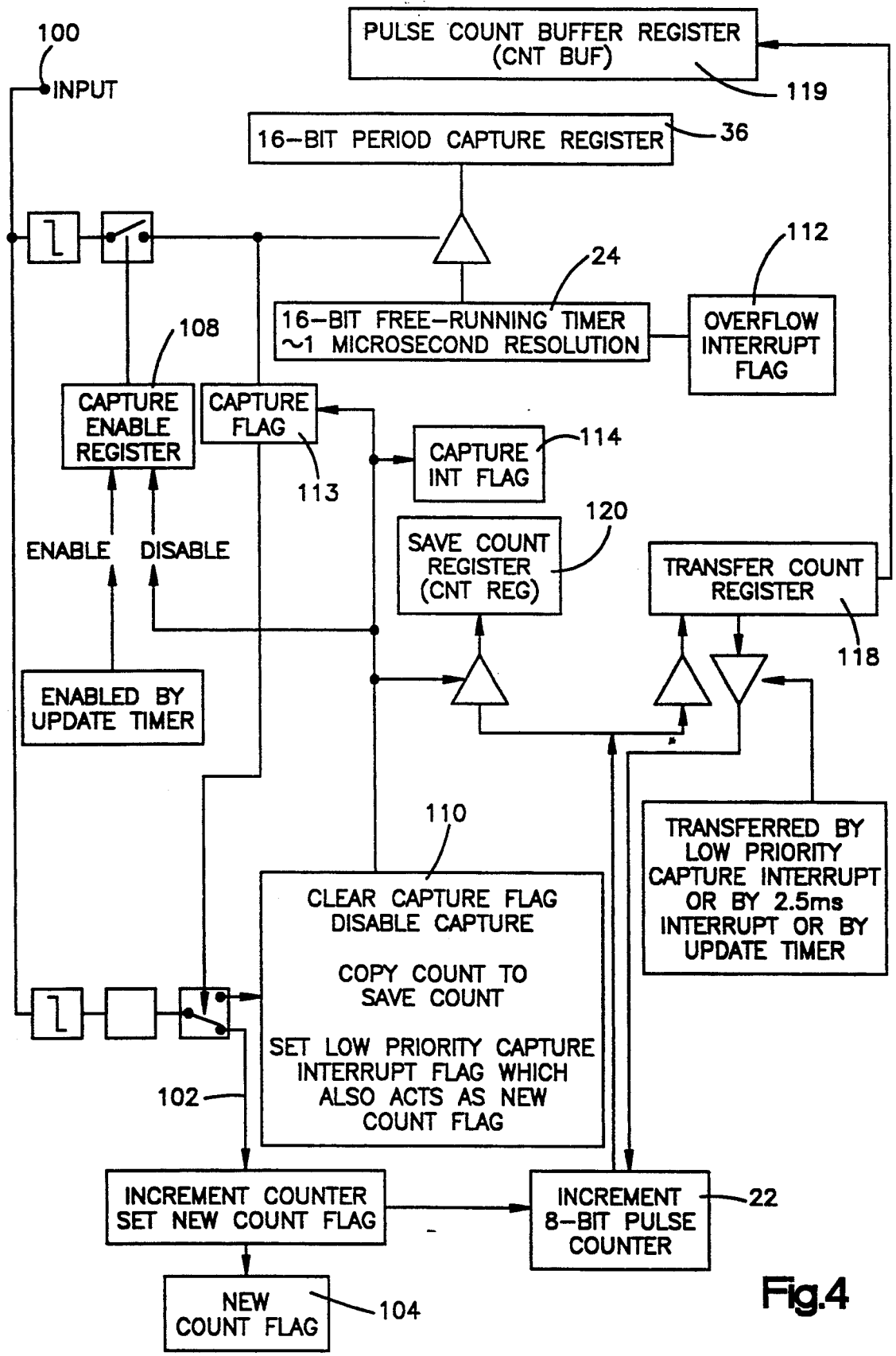
FIG. 4 is a flow chart illustrating the operation of a high priority interrupt controller embodying the present invention.

Turning now to FIG. 4, a flow chart illustrating the functions performed by the high priority interrupt control module is illustrated. Pulses are received at an input 100 which in the case of channel A corresponds to the input A in FIG. 1. When a capture has not been enabled, the incoming pulse causes the software branch 102 to be executed and in particular, a "new count flag" 104 is set and an 8-bit pulse counter 22 is incremented. The software routine is then exited.

The software implements an "update timer" (element 44 in FIG. 2) which in the preferred device is programmable by the user. The update timer determines the sample intervals between captures. For example, if the update timer is set to 1 second, data will be captured approximately every second and used to calculate the frequency rate of the incoming pulses and other data desired by the user.

The need for a capture is signalled, as will be explained, directly or indirectly by the update timer. As seen in the flow chart, and represented by the block 108, a capture register is enabled so that upon the next incoming pulse a capture routine is executed. However, the high priority capture routine only performs a minimal number of tasks needed to store data for use by software operating at a lower priority level. In particular, the next incoming pulse causes the contents of the PCA timer 24 to be transferred to a period capture register 36 which is part of the PCA hardware. In addition, an overflow bit associated with the period capture register is copied.

In the illustrated embodiment, the PCA timer is a 16 bit free running timer which preferably increments at 1 microsecond intervals. Consequently, the timer will overflow every 65,536 counts or every 65,536 microseconds. The overflow information must be saved in order to arrive at an accurate timer count. The actual PCA timer counts that have occurred since the last capture is equal to the number of counts in the timer register plus 65,536 multiplied by the number of timer overflows that occurred. Upon capture, a capture flag 113 is set by the PCA hardware which in turn causes a software module represented by the block 110 to execute in order to disable further captures and to copy information such as the accumulated counts into one or more pulse counters. In addition, the contents of the 8-bit pulse counter 22 ("CNT") is saved to a save count register 120.

It is important to note that, during the high priority capture process, the "CNT" register is not incremented, even though a pulse has occurred. As will be seen later, the value in the save count register 120 will be incremented in the low priority capture interrupt software to account for the uncounted pulse.

The software also sets a low priority capture interrupt flag 114 which is used to initiate the execution of low priority software module to complete the capture task. As a result, performance of the device is not degraded since the time consuming tasks of actually calculating the rate, etc. are done at low priority and in between higher priority tasks.

Figure 4A:
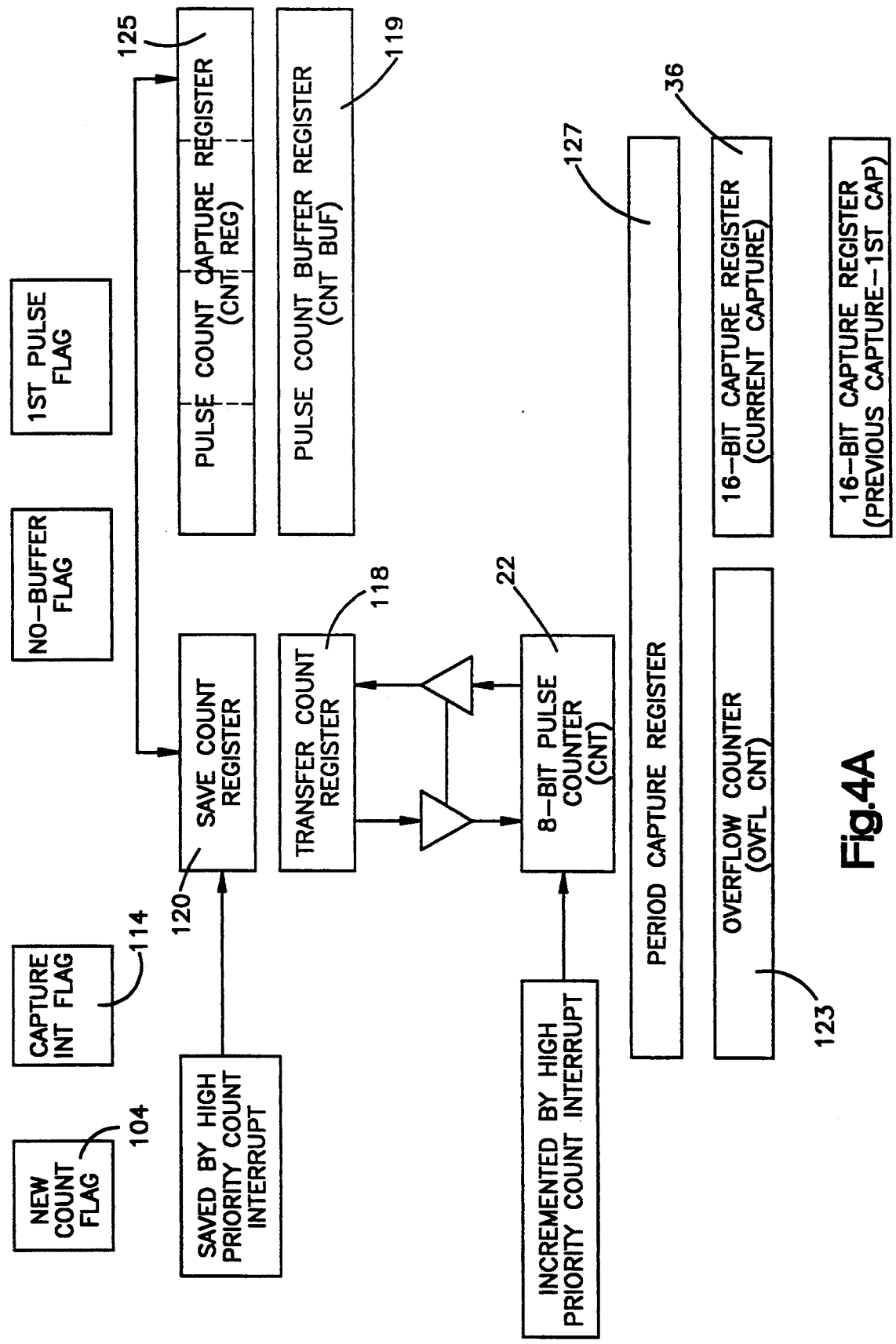
FIG. 4A is a flow chart illustrating the operation of a low priority capture interrupt controller embodying the present invention.

The low priority capture interrupt software performs several functions. Referring to FIGS. 4 and 4A, this interrupt occurs whenever the capture interrupt flag 114 is set. During execution of this routine, the contents of the "CNT BUF" register 119 are added to the contents of the save count register 120 (which is actually the low byte of the "CNT REG" pulse count capture register 125) after the save count register has been incremented to account for the previously uncounted input pulse. The net count difference between the contents of the save count register and the "CNT" register are saved as the new value of "CNT BUF" for the next capture cycle. The "CNT" register is cleared during this exchange. At the end of this process, the "CNT BUF" register contains the pulse counts for the next capture cycle and the "CNT REG" register contains the counts for the just-completed capture cycle.

The state of the PCA timer stored in the capture register 36 is added to a period capture register 127. Both the period capture register and pulse count capture register are used in calculating the frequency, etc.

To improve performance, the actual transfer of counts between the 8 bit pulse counter 22 ("CNT") and the pulse count buffer register ("CNT BUF") 119 is achieved using an intermediate transfer count register 118. In the disclosed embodiment, the transfer count register 118 is actually the accumulator of the microprocessor. To effect the transfer of counts to the pulse count buffer register 119, the contents of the accumulator, which is set to zero prior to the transfer, is exchanged with the 8 bit pulse counter 22. By using an accumulator exchange, interrupts are not disabled. Following the exchange, the counts transferred to the accumulator 118 are added to the pulse count buffer register 119.

If the capture was for a first pulse indicating the beginning of a capture period, the rate calculation is not enabled. Otherwise, a "do rate" flag is set to indicate that the actual rate calculation should be made.

As seen in FIG. 3, a low priority 2.5 millisecond timer interrupt is implemented using another timer internal to the microprocessor. Among other functions, this interrupt causes the rate calculation software to execute if the "do rate" flag has been set by the low priority capture interrupt software at the completion of the capture. Because the rate calculation task executes at a lower priority, the execution of this task in software does not effect the performance of the device since the software is executed only when higher priority tasks are not executing.

In the disclosed implementation, and as seen in FIG. 4, the incoming pulses which generate the high priority interrupt increment an 8 bit counter. Since the 8 bit counter will overflow every 256 counts the information contained in this counter must be transferred or buffered to the transfer register 118 and then buffered or accumulated in the pulse count buffer register, "CNT BUF", 119 To minimize execution time of the high priority count interrupt, this transfer buffering does not occur with each incoming pulse. Instead, the above-described 2.5 millisecond interrupt is used to cause the transfer and accumulation of counts from the 8 bit pulse counter 22 to the pulse count buffer register, using the accumulator 118 and the previously described capture technique. By transferring the counts at 2.5 millisecond intervals, the 1 byte pulse counter 22 will not overflow for frequencies less than 100,000 hertz.

In the preferred and illustrated embodiment, a low priority timer interrupt (represented by block 140 in FIG. 3) is generated whenever the PCA timer overflows. Referring also to FIG. 4A, whenever an overflow occurs, an overflow counter 123 (implemented in software) is incremented. Next the overflow counter 123 is compared to the update timer value and if the overflow counter equals or exceeds the update time, the high priority capture operation is enabled as described above. Thus, in the preferred embodiment, the update timer is only checked upon a PCA overflow which, as described above, occurs every 65,536 microseconds if the timer is incrementing every 1 microsecond.

Figure 5:
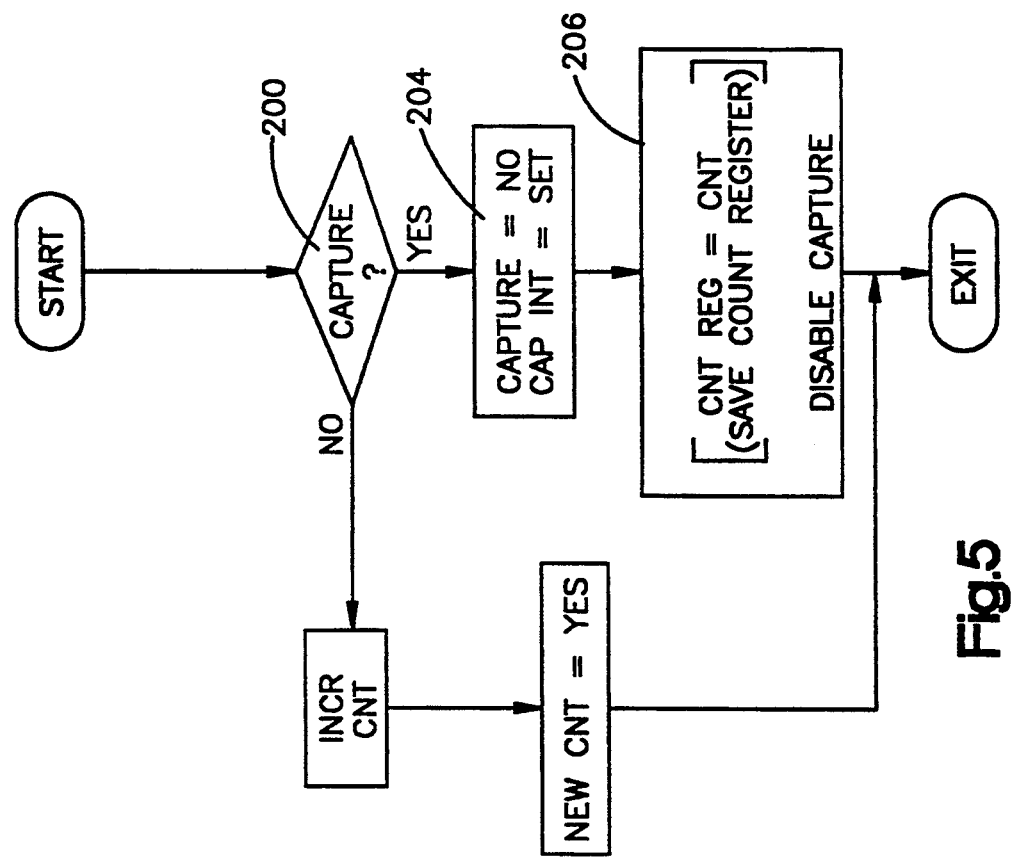

FIGS. 5-12 flow chart the interrupt and other software routines that are executed during operation of the counter. Turning first to FIG. 5, the steps performed by the system each time a pulse is received at one of the inputs is illustrated. Whenever a count is received at the input, a high priority interrupt is generated which vectors to the routine shown in FIG. 5. The decision block 200 determines whether a capture has been accomplished and if it hasn't, the 8-bit pulse counter 22 is incremented and the routine is exited.

A new count flag 104 is set to "YES" to indicate to the zero timer software, described later, that a pulse has occurred. If no pulses occur during a given time period, known as the "zero time", then the rate is set to zero. It is not necessary to use a flag at this point for the detection of the new count. Lower priority interrupt software can determine that a new pulse has occurred by observing the contents of the 8 bit pulse counter 22 or "CNT BUF" register 119. The "NEW CNT" flag is shown here for clarity. If capture has occurred, as indicated by the blocks 204, 206, further captures are disabled and the capture interrupt flag 114 (shown in FIGS. 4 and 4A) is set. This capture interrupt flag is operative to generate a low priority capture interrupt which cause a routine to be executed (between high priority tasks) that finishes the capture function.

As indicated in FIG. 4, before exiting the high priority capture interrupt routine (when a capture has occurred), the contents of the 8-bit pulse counter 22 ("CNT") is saved in a "save count register". In the disclosed implementation, a least significant byte of a count capture register 125, "CNT REG" (see FIG. 4A) acts as the "save count register" 120 (shown in FIG. 4) since during this portion of the capture routine it is not being used. Further captures are disabled by directly instructing the capture enable register 108 (FIG. 4).

The new count flag is not shown in block 204 because the "CAP INT" flag 114 indicates the new count state to the zero timer software directly or indirectly (via the low priority interrupt software), as explained later.

In the disclosed system using the 83C51F microprocessor, an interrupt is generated whenever the PCA timer overflows or whenever the capture interrupt flag is set. Either of these events will cause the system to vector to the same interrupt location.

Figure 6:
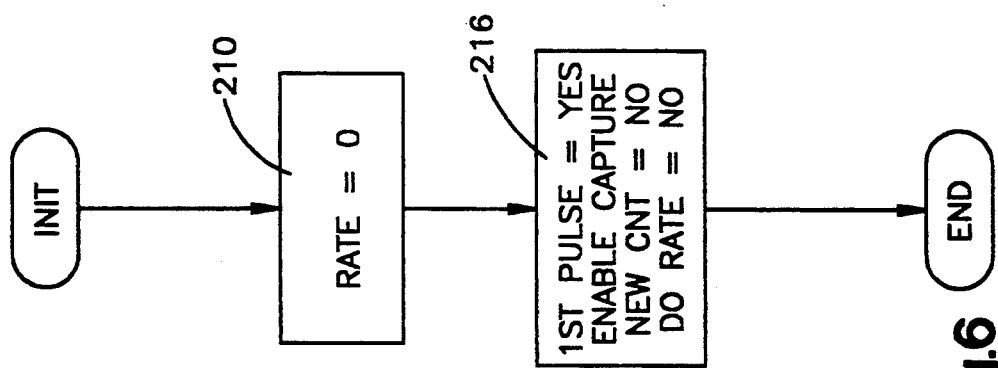
FIGS. 5-12 illustrate functional flow charts of the functions performed by the various modules that form part of the present invention.

FIG. 6 illustrates the routine that is executed upon power up of the system. When the system is first powered up, the calculated rate is set to zero at (as indicated by block 210) since it should be zero at start up. As indicated in the block 216, a first pulse flag is set to "yes", the capture enable register 108 is enabled, a new count flag is set to "no", and the "do rate" flag is set to "no"; the routine is then exited. With this initial routine, the very first pulse will cause a capture sequence to be performed in order to store the initial count of the PCA timer which will be used to calculate the actual sample time interval when a subsequent capture is made.

Figure 7:
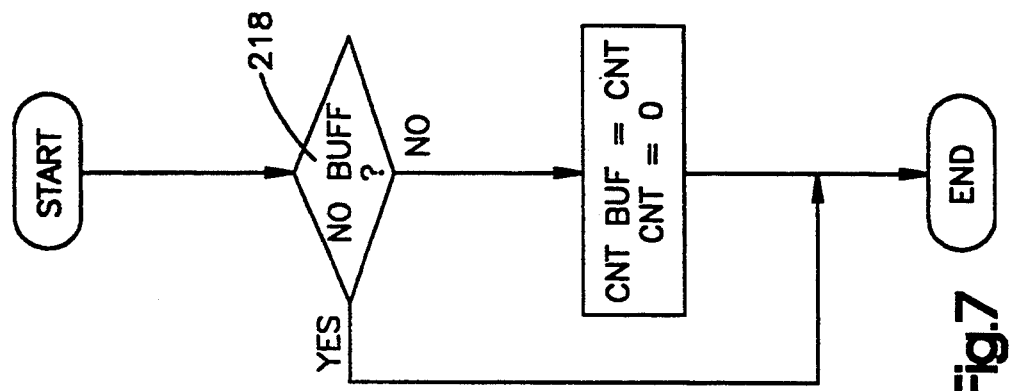

FIG. 7 illustrates the routine that is performed whenever the 2.5 millisecond timer generates an interrupt. The first decision block 218 is used to determine whether the data in the 8-bit pulse count register 22 should be transferred to the buffer register 119 ("CNT BUF"). During certain operations, as will be explained, buffering of the counts from the 8-bit pulse count register are temporarily disabled. This condition is signalled by a "no-buffer" flag. If the flag is set, the routine is exited immediately. If it is not set, the counts in the 8-bit pulse count register 22 are added to the pulse count buffer register 119 (via the transfer register 118) and the 8-bit pulse count register is zeroed. Preferably this is achieved by exchanging the contents of the accumulator which was previously set to 0, with the pulse count register 22. Using this technique does not disable interrupts.

Figure 8:
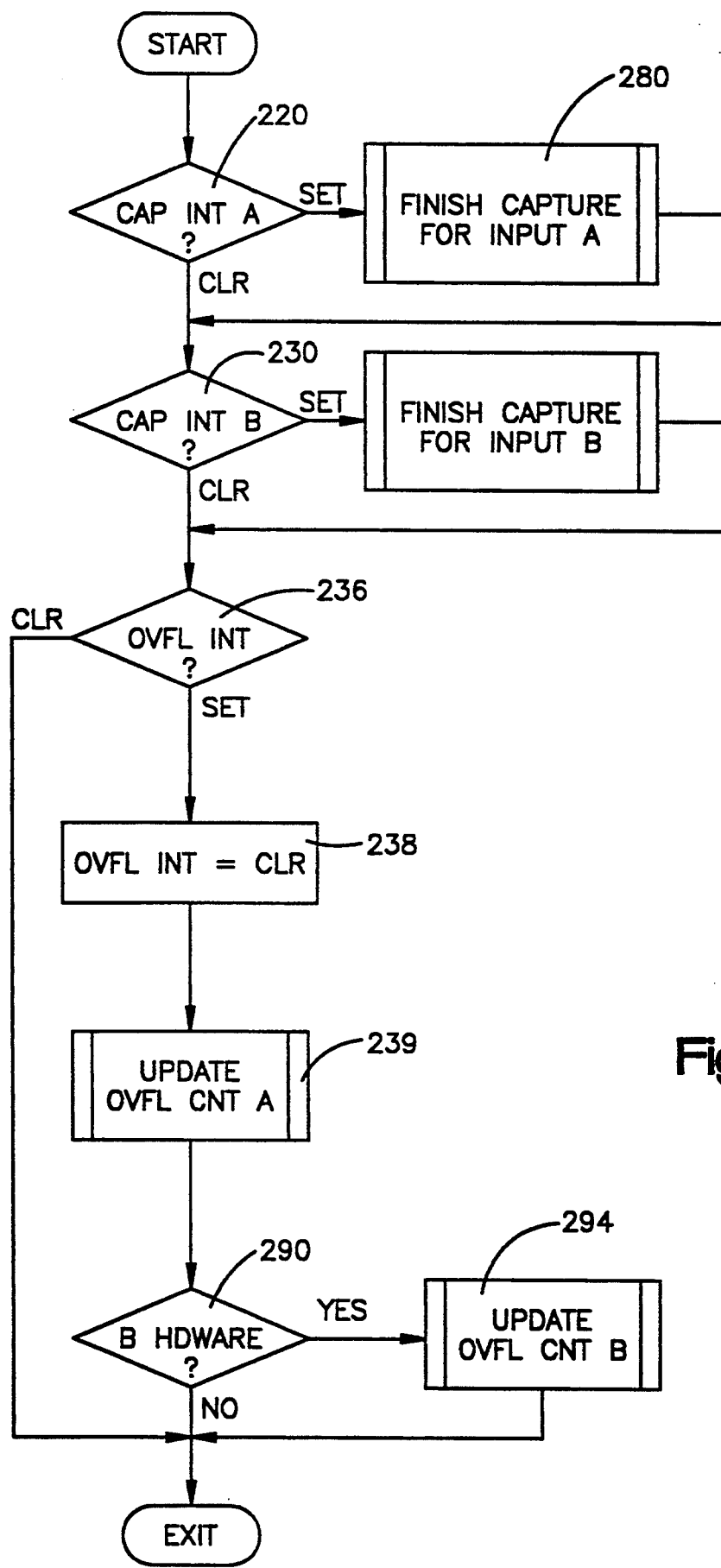

Turning now to FIG. 8, in the illustrated system, a "PCA interrupt" is generated whenever the PCA timer overflows or whenever the capture interrupt flag 114 is set. Either of these events will cause the control system to vector to a common location. For this reason, the routine must test what event occurred to cause the interrupt. The first decision block, 220 determines whether the capture interrupt flag 114 for channel A has been set. If it has not, it proceeds to decision block 230 to determine whether the capture interrupt flag for channel B has been set. Normally, if neither of the capture interrupt flags have been set, the reason for entering this routine will be the setting of the overflow interrupt 112 shown in decision block 236. The next block 238, clears the overflow interrupt flag and then executes an "update routine" 239 shown in FIG. 9.

Figure 9:
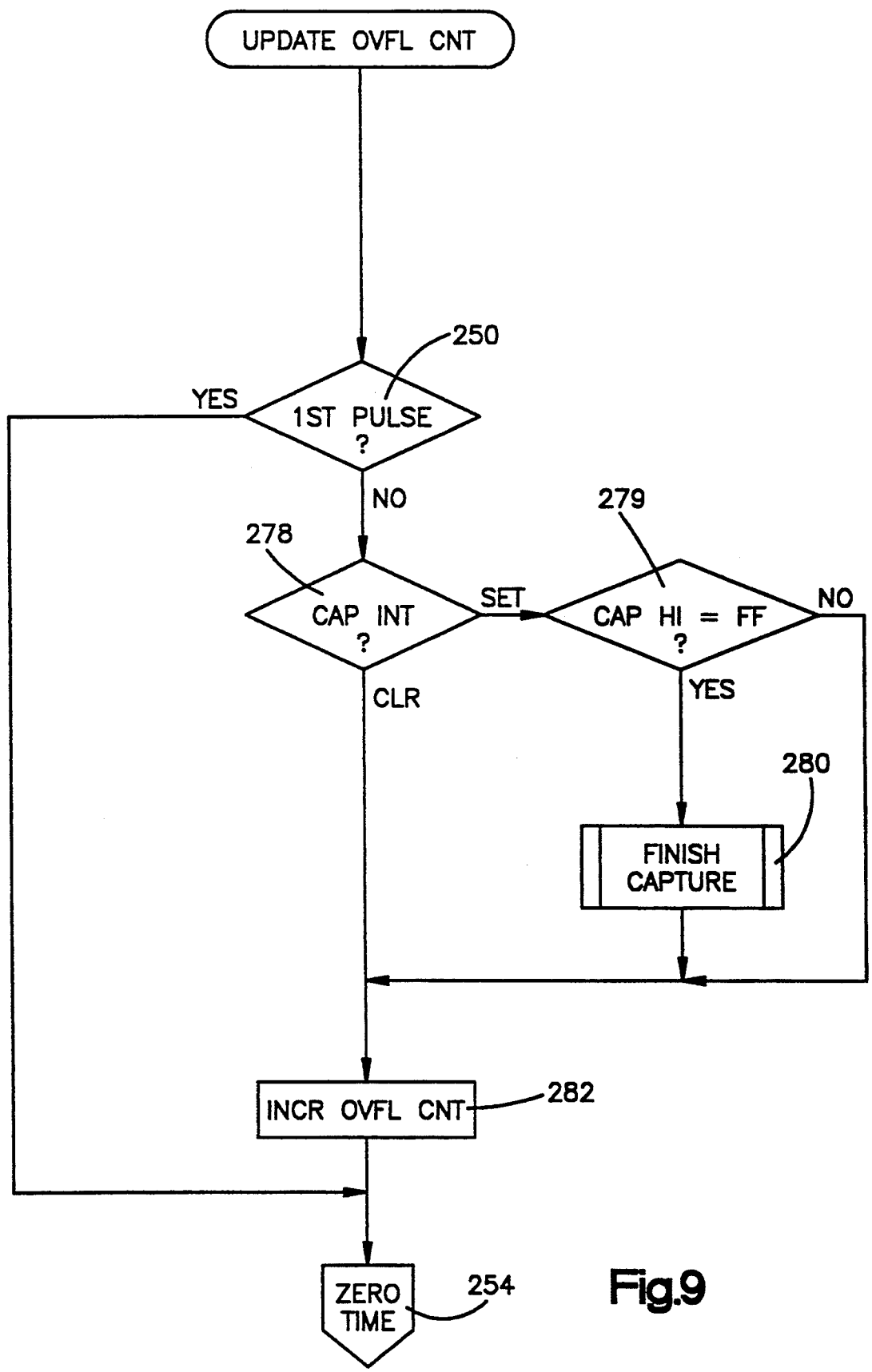
Figure 10:
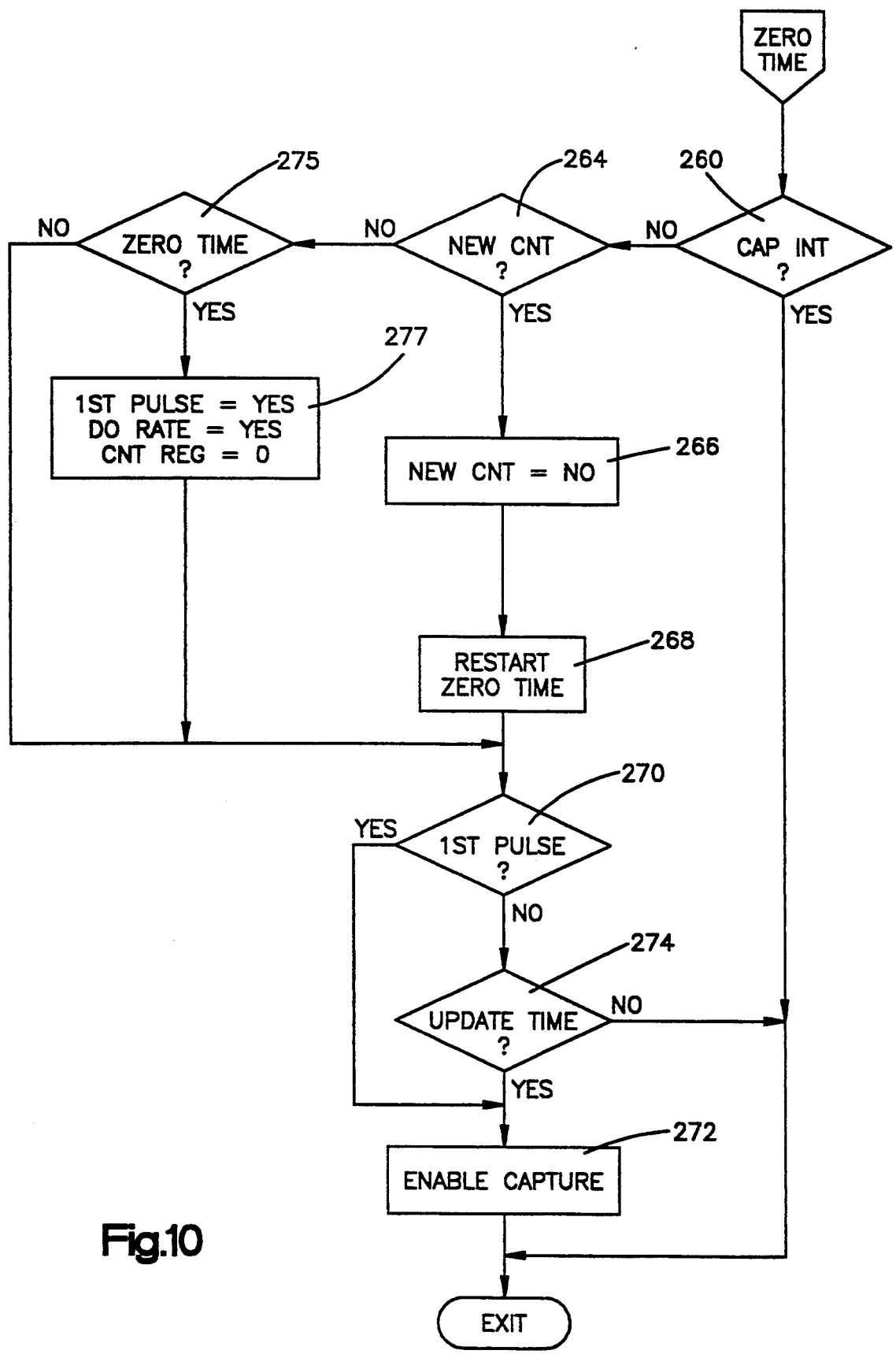

Turning to FIG. 9, the first decision block 250 determines whether a "1ST PULSE" flag has been set to "YES", indicating that the software is waiting for a first pulse. If it has, the routine jumps to a zero timer routine, the beginning of which is indicated by the reference character 254 and which is fully shown in FIG. 10. Referring to FIG. 10, the routine determines whether a count has been received since the zero timer was initialized. The zero timer is used to determine when a "zero" rate has occurred. In other words, if pulses aren't received within a predetermined interval of time as determined by the zero timer, the system recognizes that the pulse rate is zero.

The first decision block 260 in FIG. 10 determines whether the capture interrupt flag 114 (FIG. 4) has been set. If it has been set, it is an indication that a pulse has been received at the input since the capture interrupt flag 114 can only be set in response to a high priority interrupt which in turn is only executed upon receipt of a pulse. If the flag is set, the routine is exited. If the capture interrupt flag has not been set, the decision block 264 determines whether a new count flag 104 (FIG. 4) has been set which is set whenever a pulse is received or whenever low priority capture has been finished, as described later. If the new count flag has been set to indicate a count has been received, the block 266 sets the new count flag 104 to "no" and following that step, the zero timer 268 is zeroed to start a new monitoring interval.

The decision block 270 determines whether the first pulse flag has been set and if it has the routine jumps to the block 272 and enables the capture enable register 108. An initial capture sequence is executed in order to store the initial state of the PCA timer so that upon a subsequent capture, the period can be determined. The decision block 274 determines whether the update timer 44 has timed out and if it has, the capture enable register is enabled so that a capture will be performed on the next incoming pulse. If the update timer has not timed out, the routine is exited.

Returning to decision block 264 in FIG. 10, if the new count flag 104 has not been set, the routine branches to the zero timer 275 and determines whether the timer has timed out indicating that a second pulse has not been received within the zero time period. If the timer has timed out, the block 277 is executed which sets the 1ST PULSE flag to "YES", sets the "DO RATE" to "YES" and zeroes the pulse count register 125, "CNT REG" (see FIG. 4A), causing the rate to be calculated as zero. The routine then jumps to the decision block 270. If the zero timer 275 has not timed out, the routine jumps to the decision block 270.

Returning now to FIG. 9, the decision block 278 determines whether the capture interrupt flag has been set. If it has, the routine must determine whether an overflow occurred before or after a capture. It must be remembered, that this routine is entered upon the occurrence of an overflow or whenever the CAPTURE INT FLAG 114 has been set on either input A or B. The determination is made by checking the high byte of the period capture register 36 as indicated by the decision block 279. If the high byte is equal to FFH, this is an indication that the overflow occurred after the capture since upon overflow, the high byte of the period capture register 36 is zeroed. If it is determined that the overflow occurred just prior to capture, the routine jumps to block 282 and causes the overflow counter 123 to increment. If the decision block 279 determines that the overflow occurred after the capture (by finding the high byte not equal to FFH), a finish capture routine 280 (to be described and shown in FIGS. 11 and 12) is executed.

Returning to decision block 278, if the capture interrupt flag is clear, this is an indication that the routine was entered in response to an overflow in the PCA timer and the routine immediately jumps to the block 282 and increments the overflow counter 123. The routine then executes the zero timer routine 254 described above and shown in FIG. 10.

Returning to FIG. 8, after updating the overflow count for channel A, a decision block 290 is executed to determine whether the B channel is being monitored. If it is not, the routine is exited, otherwise the block indicated by the reference character 294 is executed to update the overflow count for channel B. The routine executed is the routine shown in FIGS. 9 and 10.

Figure 11:
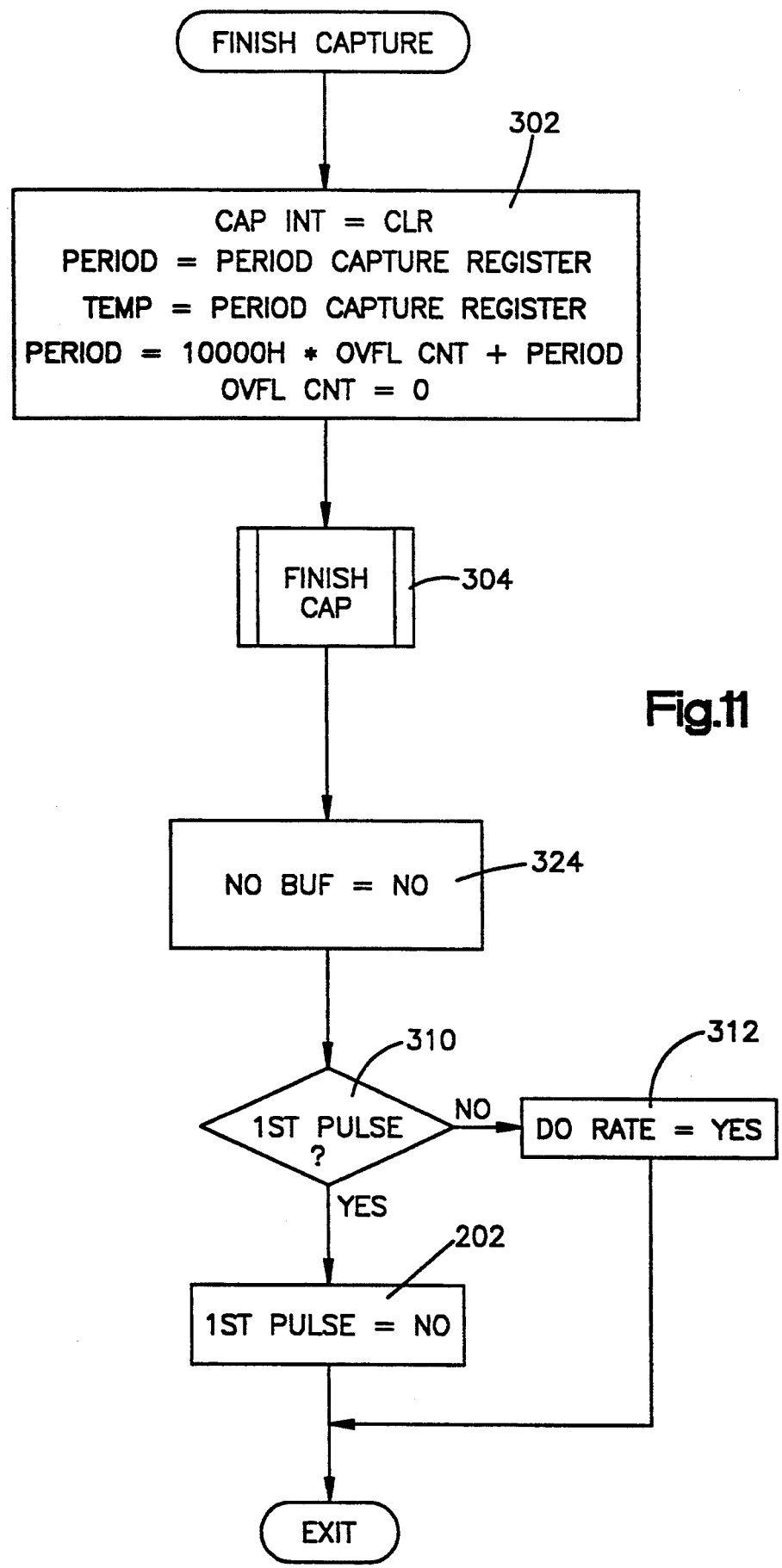
Figure 12:
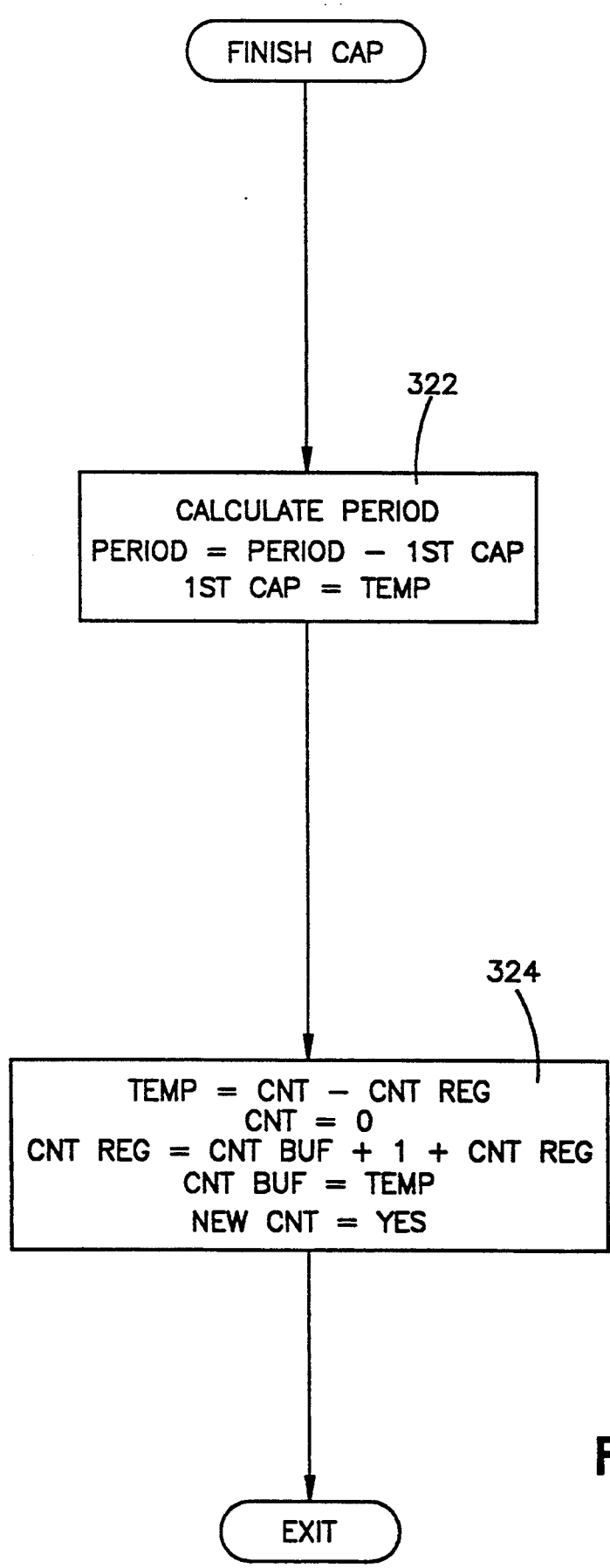

Returning to FIG. 8, as indicated above, this routine is entered either upon overflow of the PCA timer or upon setting of a capture interrupt flag 114 for either channel A or channel B. The decision block 220 determines whether the capture interrupt flag 114 (FIG. 4) for channel A has been set. If it has, the block 280 is executed to finish the capture for channel A. The finish capture routine is shown in FIGS. 11 and 12. This routine is performed as a low priority task and is therefore interrupted whenever a high priority interrupt (caused by the receipt of a pulse) is generated.

As seen in the block 302, this routine first clears the capture interrupt flag 114 for the channel being updated; it then sets a 4-byte period variable, PERIOD, to equal the current value in the period capture register 36 (FIG. 4) and also sets a variable TEMP to also equal the current capture value. Next the quantity in the PERIOD variable is increased by the quantity determined by the number of overflow counts times 1000H. Following this calculation, the overflow counter 123 is set to zero. As explained above, the timer overflows every 65,536 counts. Therefore the PERIOD variable contains the current count in the period capture register 36 (FIG. 4) plus 65,536 times the number of overflows that have occurred.

As indicated in the block 304, a secondary finish capture routine, shown in FIG. 12, is then executed. The routine executes the block 322 in which the actual time that has elapsed since the previous capture is calculated. The variable 1ST CAP is the state of the PCA timer at the previous capture. As indicated in the first step in the block 322, the prior PCA timer state (stored in 1ST CAP) is subtracted from the current period to arrive at the number of timer counts that have occurred since the last capture. The 1ST CAP variable is then set to the temporary variable (TEMP) which as explained above in describing the block 302, contains the state of the PCA timer at the current capture. By setting the variable "1ST CAP" to the current PCA timer state, this value is now stored and ready for use as the "previous timer state" for the next capture calculation.

The routine then executes the steps listed in the block 324. The temporary variable is set to the difference between the value in the pulse counter 22 ("CNT") and the value stored in the pulse count capture register ("CNT REG"). As explained above, up to this step in the routine, the CNT REG register contains the value of the pulse counter 22 at the time of capture. By subtracting this number from the number now in the pulse counter 22, the number of pulse counts since the capture can be determined. The pulse counter 22 is then zeroed. Following this step, the contents of the count buffer 119 and "1" are added to the count capture register (CNT REG). This register then includes the total accumulated pulse counts that have occurred since the last capture and in particular includes the number of counts that had accumulated in the pulse counter 22 at the time of capture plus the number of counts that had been accumulated in the count buffer 119 and to this quantity is added an additional count since during the high priority capture routine, pulse counting is disabled. Finally, the count buffer 119 is set equal to the temporary variable (TEMP), which as indicated above contains the number of pulse counts accumulated since the capture.

With the disclosed routine, counts received at the input are not lost during the capture routines and all counts received at the inputs are in effect counted.

The secondary finish capture routine is exited and the block 324 is executed. The "NO BUFFER" flag is set to "NO" to re-enable buffering. The decision block 310 determines whether the FIRST PULSE flag has been set to "NO". If it has, this is an indication that more than one pulse has been received. A "DO RATE" flag 312 is set which causes execution of a low priority task to perform the arithmetic functions to determine pulse rate, etc. If the FIRST PULSE flag has been set to "YES", the block 202 is executed setting the FIRST PULSE flag to "NO" so that upon entering this routine subsequently, the DO RATE flag will be set.

Although the invention has been described with a certain degree of particularity, it should be understood that those skilled in the art can make changes to the invention without departing from the spirit or scope of the invention as hereinafter claimed.

What is claimed is:

1. A computer-implemented method for determining the frequency of a time varying signal including a series of pulses, comprising the steps of:
   a) providing an input for receiving said time varying signal;
   b) providing a free running period timer by which starting and ending times of a sample period are determined;
   c) providing an update timer for signaling that a predetermined sample period has been completed;
   d) storing the state of said free running period timer in a storage element at the commencement of a sample period;
   e) providing a high priority interrupt control routine that is at least partially executed upon generation of a high priority interrupt;
   f) generating a high priority interrupt upon the receipt of one of said signal pulses at said input;

g) upon generation of said high priority interrupt, executing said high priority routine to determine whether said predetermined sample period has been completed by said update timer;

h) in response to said predetermined sample period having not been completed, incrementing a pulse counter and thereupon exiting said high priority interrupt routine;

i) in response to said predetermined sample period having been completed, executing a capture sequence, comprising the steps of:
   i) transferring a state of said free running period time to a period capture register;
   ii) generating a first low priority interrupt and thereupon exiting said high priority routine;

j) executing a secondary capture routine in response to generation of said first low priority interrupt so long as said high priority control routine is not being executed, said secondary capture routine including the steps of:
   i) subtracting the state of the free running period timer stored in the storage element from the state of the free running period timer stored in the period capture register to provide a precise sample period time interval; and,
   ii) providing the total pulses received in said pulse counter during said precise sample period to a count register; and k) calculating the frequency of said signal using said sample period time interval and said total pulses.

2. The method of claim 1 further including the steps of:
   a) providing a second low priority routine for calculating the frequency of said time varying signal using the precise sample period and the total pulses stored in said count register;
   b) generating a second low priority interrupt at predetermined intervals; and,
   c) executing said second low priority routine in response to said second low priority interrupt so long as said high priority routine or said secondary capture routine are not being executed.

3. The method of claim 2 wherein said high priority interrupt control routine is implemented as instructions stored in a processor memory and said free running period timer is implemented in processor hardware.

4. A system for determining a frequency of a signal being measured at an input, comprising:
   a) a processor for executing sequentially, sets of instructions;
   b) a memory associated with said processor for storing at least some of said sets of instructions said memory storing a set of executable data capture instructions for performing a data capture function, said set of data capture instructions having a group of high priority instructions and a group of low priority instructions;
   c) a free running period timer for providing starting and ending times of a sample period;
   d) an update timer for signaling that a predetermined sample period has been completed
   e) means for generating a high priority interrupt signal upon receipt of a signal pulse from said signal being measured at said input;
   f) first storage means for storing the value of said free running period timer at the commencement of a sample period;
   g) means responsive to said high priority interrupt signal for executing a high priority routine to determine whether said predetermined sample period has been completed by said update timer, in response to said predetermined sample period having not been completed, incrementing a pulse counter and thereupon exiting said high priority interrupt routine, in response to said predetermined sample period having been completed, transferring a state of said free running period timer to a second storage means and generating a first low priority interrupt and thereupon exiting said high priority routine:
   h) a secondary capture routine execution means in response to generation of said first low priority interrupt so long as said high priority control routine is not being executed for;
      i) subtracting the state of the free running period timer stored in the first storage means from the state of the free running period timer stored in the second storage means to provide a precise sample period time interval: and
      ii) providing the total pulses received in said pulse counter during said precise sample period to a count register: and
   i) means for calculating the frequency of said signal using said sample period time interval and said total pulses.

5. The system of claim 104 further including a low priority interval timer means including means for generating a second low priority interrupt at predetermined intervals and including means for transferring control to a low priority timer routine operative to manage data storing and transfer functions between temporary registers and accumulating registers and being further operative to schedule the execution of arithmetic calculations for calculating the frequency rate of said time varying signal.

6. A combined computer hardware and software system for sensing and counting pulses input to the system, capturing a timer count corresponding to the sensing of a pulse and periodically calculating a pulse frequency over a time period that commences and terminates with the sensing of a pulse and wherein differing priorities are sasigned to functions associated with sensing and counting pulses, capturing time counts and calculating pulse frequencies such that the execution of high priority functions are not compromised by the execution of low priority functions and such that system resources are utilized efficiently, the system comprising:
   a) a signal sensing and counting means for detecting arrival of a pulse and an incrementable counter maintaining a count of pulses detected by the system;
   b) a free running first timer means for incrementing a time count at a constant time interval;
   c) a capture means switchable between an enabled and non-enabled condition and responsive to said enabled condition for
      i) transferring a time count value in a first time count capture register to a second time count capture register and transferring a pulse count value in a first pulse count register to a second pulse count register;
      ii) transferring a current time count value of said first timer means to the first time count capture register;

iii) transferring a current pulse count value of said incrementable counter first pulse count capture register;
iv) generating a low priority interrupt signal; and
v) switching said capture means to a non-enabled condition;

d) a second timer and indicator means for incrementing a timer count at a constant time interval and indicating a sampling period elapsed condition when a predetermined sampling time period has elapsed since a most recent capture was executed;

e) a high priority interrupt routine execution means in response to the detection of an arriving pulse by the signal sensing and counting means for:
i) incrementing the pulse count of said incrementable counter; and,
ii) determining a state of said second timer means and indicator:
  aa) in response to said second timer means and indicator indicating a sampling period elapsed condition, providing a signal which switches said capture means to an enabled condition and exiting said high priority routine; and,
  bb) in response to said second timer means and indicator not indicating a sampling period elapsed condition, exiting said high priority routine; and f) a calculation means for calculating a pulse frequency upon receipt of said low priority interrupt signal from said capture means, said calculation of pulse frequency being executed only when said high priority interrupt routing is not being executed, said frequency calculation being based on time count and pulse count values stored in the first and second time count capture and first and second pulse count capture registers.

* * * * *